(12) United States Patent
Pautsch et al.

(10) Patent No.: US 6,366,461 B1
(45) Date of Patent: Apr. 2, 2002

(54) SYSTEM AND METHOD FOR COOLING ELECTRONIC COMPONENTS

(75) Inventors: Gregory W. Pautsch, Chippewa Falls; Kent T. McDaniel, Altoona; Eric Dwayne Lakin, Chippewa Falls; James Joseph Jirak, Jim Falls, all of WI (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/408,772

(22) Filed: Sep. 29, 1999

(51) Int. Cl.⁷ .................................................. H05K 7/20
(52) U.S. Cl. ...................... 361/690; 361/688; 361/689; 361/692; 361/699; 361/703; 361/704; 361/719; 361/720; 174/15.1; 174/16.1; 174/16.3; 165/80.3; 165/80.4
(58) Field of Search ................................ 361/687–692, 361/694–700, 709, 710, 717–720; 257/706, 714–716, 721, 722; 174/15.1, 15.2, 16.1, 16.3; 165/80.3, 80.4, 185

(56) References Cited

U.S. PATENT DOCUMENTS

| | | | |
|---|---|---|---|
| 4,321,423 A | | 3/1982 | Johnson et al. ............... 174/16 |
| 4,324,104 A | | 4/1982 | Horn et al. ..................... 62/77 |
| 4,381,032 A | | 4/1983 | Cutchaw ........................ 165/46 |
| 4,593,342 A | | 6/1986 | Lindsay ........................ 361/386 |
| 4,849,856 A | | 7/1989 | Funari et al. ............... 361/386 |
| 4,884,168 A | | 11/1989 | August et al. ............. 361/382 |
| 5,014,904 A | | 5/1991 | Morton ........................ 228/176 |
| 5,063,476 A | * | 11/1991 | Hamadah et al. ............ 361/697 |
| 5,083,194 A | | 1/1992 | Bartilson ..................... 357/81 |
| 5,119,759 A | | 6/1992 | Hicks .......................... 118/712 |
| 5,166,775 A | | 11/1992 | Bartilson ..................... 361/383 |
| 5,218,513 A | * | 6/1993 | Brown ......................... 361/689 |
| 5,270,572 A | * | 12/1993 | Nakajima et al. ........... 257/714 |
| 5,311,060 A | | 5/1994 | Rostoker et al. ............ 257/796 |
| 5,315,479 A | | 5/1994 | Bartilson ..................... 361/690 |
| 5,321,581 A | | 6/1994 | Bartilson et al. ............ 361/695 |
| 5,361,188 A | * | 11/1994 | Kondou et al. .............. 361/695 |
| 5,410,451 A | | 4/1995 | Hawthorne et al. ......... 361/760 |
| 5,422,787 A | * | 6/1995 | Gourdine ..................... 361/697 |
| 5,471,850 A | * | 12/1995 | Cowans ....................... 361/700 |
| 5,563,768 A | * | 10/1996 | Perdue ........................ 361/695 |
| 5,592,363 A | * | 1/1997 | Atarashi et al. ............ 361/689 |
| 5,653,285 A | * | 8/1997 | Lee ............................. 165/185 |
| 5,760,333 A | * | 6/1998 | Kitahara et al. ........... 174/16.3 |
| 5,768,104 A | | 6/1998 | Salmonson et al. ......... 361/704 |
| 5,801,924 A | | 9/1998 | Salmonson .................. 361/719 |
| 5,823,005 A | * | 10/1998 | Alexander et al. .......... 361/695 |
| 5,926,367 A | | 7/1999 | Gutierrez et al. ........... 361/695 |
| 5,946,190 A | * | 8/1999 | Patel et al. .................. 361/700 |
| 6,052,284 A | * | 4/2000 | Suga et al. .................. 361/699 |

OTHER PUBLICATIONS

"Film on Metal Leaded Chip Carrier", *IBM Technical Disclosure Bulletin*, 31 (1), pp. 2–4, (Jun. 1988).

* cited by examiner

*Primary Examiner*—Leo P. Picard
*Assistant Examiner*—Boris Chervinsky
(74) *Attorney, Agent, or Firm*—Schwegman, Lundberg, Woessner & Kluth, P.A.

(57) ABSTRACT

A system and method for cooling individual electronic components utilizes individual manifolds to create individual flows of a negatively pressurized cooling fluid. This permits components with significantly different cooling loads to be located immediately adjacent each other on a circuit board, but without loss of space and computation time efficiencies, because cooling the components individually avoids heat generated by each component from adversely affecting the performance of the cooling system for adjacent components. A heat sink can be coupled to the components for increased heat transfer, and a preferred design of heat sink both dissipates heat and directs the flow of the fluid in an optimum manner.

22 Claims, 6 Drawing Sheets

SYSTEM AND METHOD FOR COOLING ELECTRONIC COMPONENTS

TECHNICAL FIELD

This invention is concerned with the cooling of electronic components, especially high performance components that generate significant amounts of heat.

BACKGROUND

Modern high performance computers, commonly known as supercomputers, rely on components that generate amounts of heat that would, absent a cooling system, degrade the performance of the components. Thus, it is common for supercomputers to have dedicated fluid (gas or liquid) cooling systems.

As the far less powerful personal computers increase in capability, they also are beginning to rely on components that generate amounts of heat that must be cooled with more than the simple convection air venting they have used in the past. Common approaches include the use of heat sinks to dissipate the generated heat more efficiently, and fans located immediately adjacent the hottest components (typically the microprocessors).

In any cooled computer system, cooling system design must take into account all the sources of heat under maximum load conditions, in accordance with accepted engineering principles. In simpler designs, all sources of heat are treated the same regardless of location, and their individual cooling needs are simply summed together to determine the total system need.

In some designs, the location of the components generating the greatest amounts of heat are modified to accommodate a more efficient cooling system. An example is shown in U.S. Pat. No. 5,926,367 (Gutierrez et al.). In this design, the power supply, typically a major source of heat, is physically located within a cooling air plenum (or the housing of the supply is modified in shape and size to become such a plenum). The microprocessors are mounted to the outside of the plenum and either the heat they generate is conducted directly into the plenum by the conductive material of the plenum wall, or heat sinks within the plenum at the locations of the microprocessors conduct the heat into the plenum. A fan blows or pulls air through the plenum.

DISCLOSURE OF INVENTION

The invention is a system and method for cooling a plurality of electronic components, comprising a supply of cooling fluid and a plurality of individual fluid supply manifolds. Each supply manifold directs a portion of the fluid, which flows under negative pressure, into thermal contact with its respective electronic component.

In the most preferred embodiment, a heat sink is thermally coupled to the electronic component and located within the flow of cooling fluid directed to that component. The heat sink is designed to both dissipate heat and direct the flow of the fluid in an optimum manner.

In general, the amount of heat generated by any particular electronic component is different from that generated by any other component. Thus, the use of individual sub-supplies and/or individually sized heat sinks can permit the system design to accommodate the different cooling loads placed on it.

Several variations on the configuration of the supply manifold are possible. For example, a common supply may branch into several sub-supplies of cooling fluid, each of which may be coupled to one of the plurality of individual fluid supply manifolds.

Similarly, because there typically is at least one exhaust manifold to collect cooling fluid after it flows over the electronic components, the exhaust manifold also may comprise a plurality of individual component exhaust ducts. This also contributes to the ability of the invention to accommodate different cooling loads.

DETAILED DESCRIPTION

The cooling designs of the prior art are not optimal solutions to the cooling needs of modem supercomputers. For example, the approach of Gutierrez et al. is like even simpler cooling systems in that it fails to fully address the fact that because individual components generate different amounts of heat depending on their composition, function, and the like, they are best served by individual amounts of cooling. Their approach simply moves these components physically together into a common plenum, but does not address their individual cooling needs with individual amounts of cooling. Also, moving components together for cooling purposes assumes that other factors, such as computational performance, are not compromised. Computational performance is critical in supercomputer design, and therefore it is necessary to use a more robust approach to supercomputer cooling design than is shown in Gutierrez et al.

Figure 1:
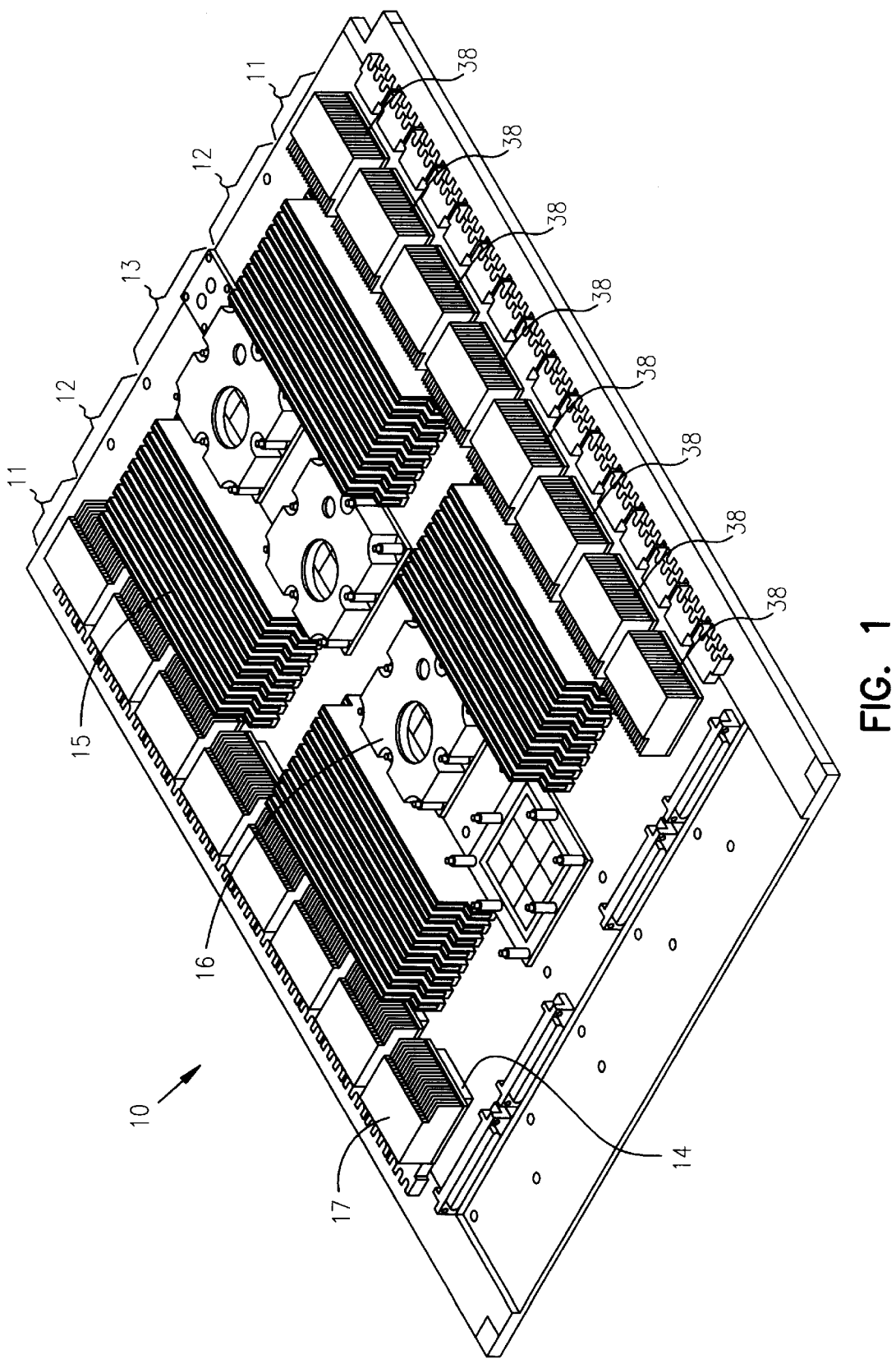
FIG. 1 is a perspective view of an example of a supercomputer circuit board, including some components of one embodiment of the invention.

FIG. 1 shows a supercomputer circuit board 10 which has been adapted for use with the invention. The electronic components on circuit board 10 include two rows 11 of eight single chip modules (SCM) 14, each SCM 14 has an individual cooling fluid supply manifold 38 located above the SCM, two rows 12 of dual in-line memory modules (DIMM) 15, and a single row 13 of 4 multichip modules (MCM) 16 (one of which has its cover removed to indicate the multichip nature of the module). (The identity, number, and arrangement of the components shown in this and all the other Figures are only examples and do not limit the scope of the invention in any manner.) However, because the electronic components have different functions and therefore different internal designs, they will generally produce different amounts of heat during normal operation. And, as indicated in FIG. 1, the components are located very close to each other on circuit board 10, as is common in the design of supercomputers. Together these factors present the design challenge of providing different amounts of cooling, to different types of components, in a very limited volume.

Figure 2:
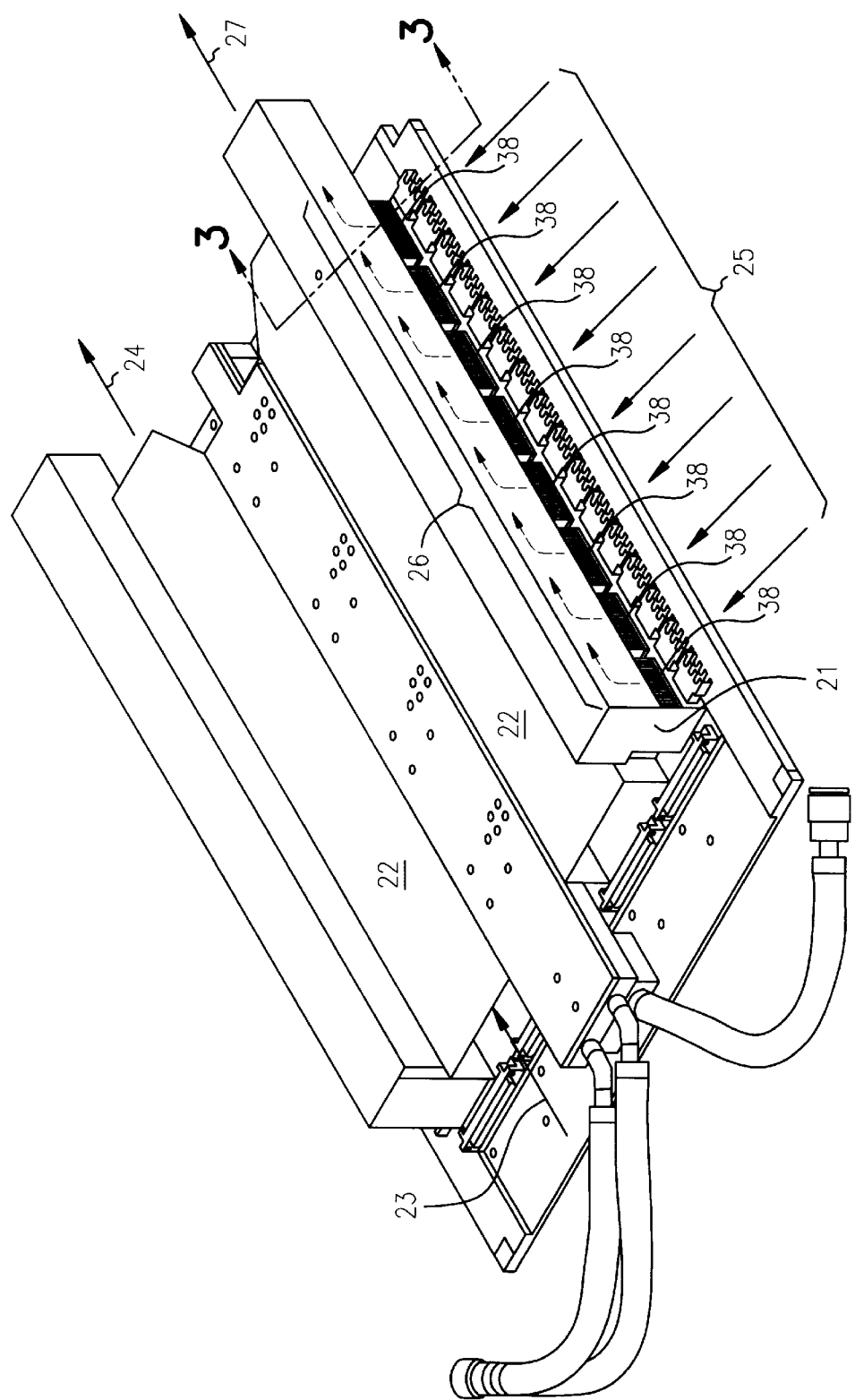
FIG. 2 is a perspective view of the supercomputer circuit board of FIG. 1, including additional elements of one embodiment of the invention.

FIG. 2 is a perspective view of circuit board 10, but now including various cooling fluid manifolds for each of the major types of electronic components (SCM, DIMM, and MCM). In particular, SCM exhaust manifold 21 over the individual cooling fluid supply manifolds 38, and DIMM cooling manifold 22 are shown; they represent two different approaches to distributing cooling fluid to electronic components. DIMM cooling manifold 22 is a traditional common manifold approach in which a supply of cooling fluid enters at one end of the common manifold (as indicated by entry arrow 23) and cools all components within the manifold, in the order that the cooling fluid encounters the components, before leaving the common manifold at the other end (as indicated by exit arrow 24). To ensure that the cooling fluid moves through the manifold at a rate consistent with the design of the cooling system, the fluid is typically introduced under positive pressure (as produced by a conventional blower fan, pump, or any other suitable means) relative to the ambient, i.e., relative to the pressure outside the manifold.

By contrast, the SCM cooling system according to one embodiment of the invention operates differently from the conventional cooling design. That is, individual streams from the supply of cooling fluid are employed for each SCM through each individual cooling fluid supply manifold 38, as indicated schematically by the collection of eight inlet arrows indicated as 25 and the collection of eight outlet arrows indicated as 26. These collections are symbolic of either individual supply streams for each SCM, as could be accomplished by use of a plurality of sub-supplies of cooling fluid (not shown in FIG. 2), each sub-supply coupled to individual cooling fluid supply manifolds 38; or, as is employed in the preferred embodiment shown in the Figures and discussed below, use of a common supply of cooling fluid that is divided into a plurality of sub-supplies of cooling fluid and directed to each individual cooling fluid supply manifold 38 and SCM by controlling the flow area and/or pressure drop in the fluid path cooling each SCM; or, by any other convenient means. All such approaches are within the scope of the invention. The cooling fluid is delivered to each SCM at a negative pressure (relative to the ambient) and into thermal contact with the SCM.

Figure 3:
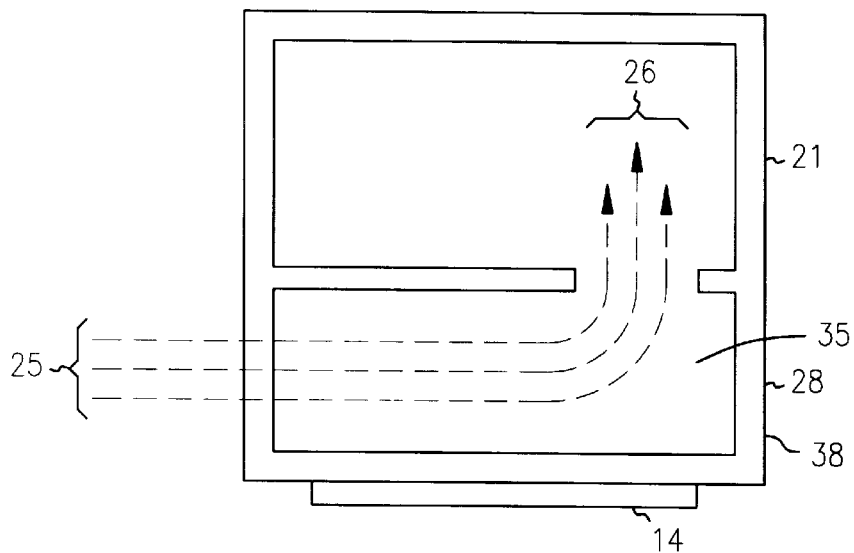
FIG. 3 is a schematic side view of the cooling fluid flow path in one embodiment of the invention, taken along the line 3—3 of FIG. 2.
Figure 4:
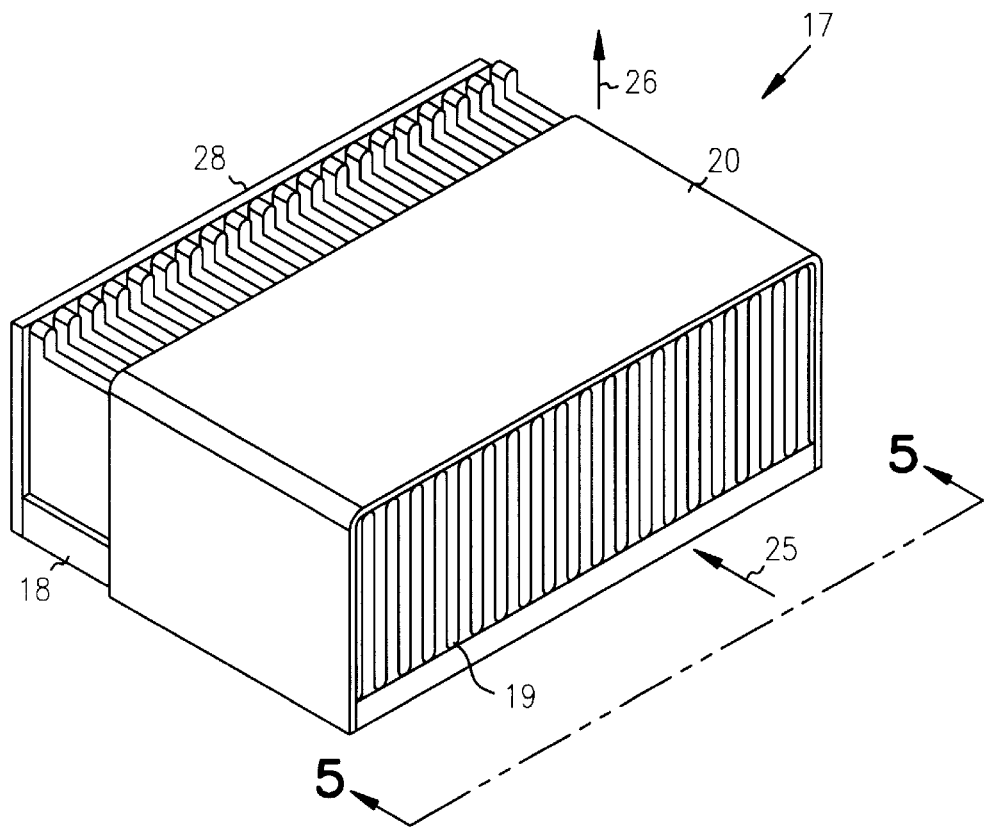
FIG. 4 is a perspective view of a preferred design of a heat sink component of a preferred embodiment of the invention.
Figure 6:
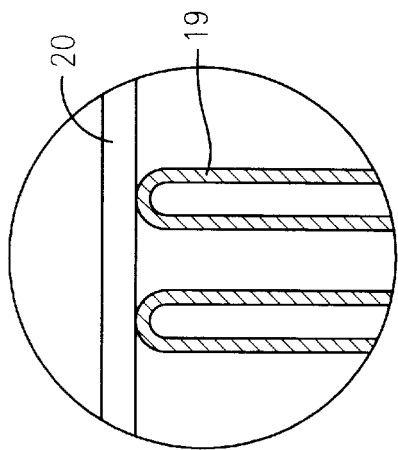
FIG. 6 is a magnified view of the region so indicated in FIG. 5.
Figure 7:
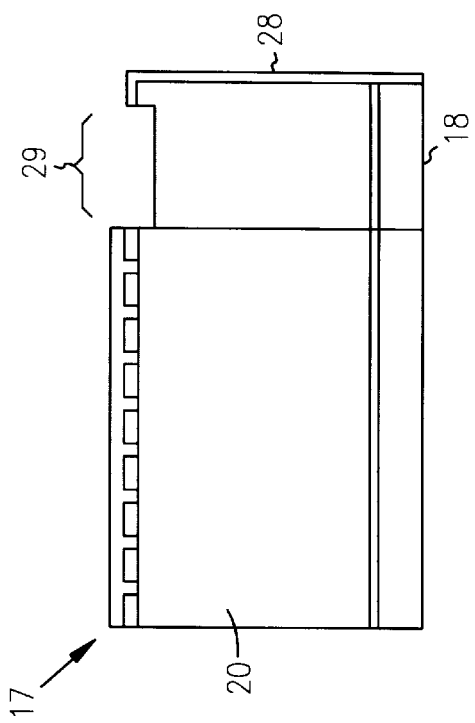
FIG. 7 is a side view taken along the line 7—7 of FIG. 5.
Figure 5:
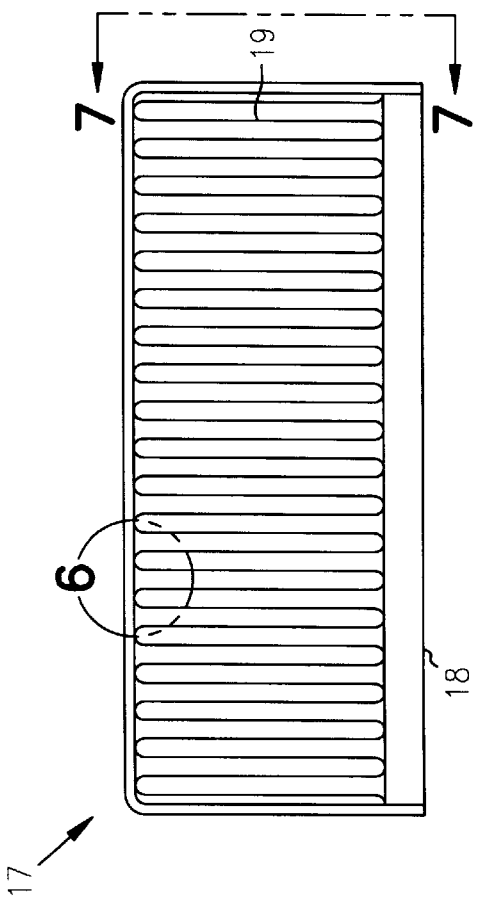
FIG. 5 is a side view taken along the line 5—5 of FIG. 4.

To illustrate this, FIG. 3 is a schematic representation of the flow of cooling fluid through an individual cooling supply manifold 38 in the vicinity of a single electronic component, for example, SCM 14. The arrows indicate the direction of cooling fluid flow as the fluid is pulled from its source (not shown) by the negative pressure within exhaust manifold 21. As shown, the region 35 above SCM 14 is open to fluid flow from at least one horizontal direction (the left side as shown), and that is the preferred embodiment when, as illustrated in FIG. 2, access from the other horizontal side of the component is restricted (in this case, by the DIMMs and their cooling manifold 22). It is within the scope of the invention, however, to draw cooling fluid over or around a component from any convenient direction and/or from multiple directions. In doing so, there may be tradeoffs between thermal performance and manufacturing considerations related to the configuration of the manifolds, other components, required component cooling surface area available, and the like, but any particular embodiments produced by making such tradeoffs are considered to be within the scope of this invention. In particular, the configuration of the opening into region 35 and the outlet from region 35 can be modified in accordance with known thermodynamic principles to optimize the cooling of SCM 14. It is also possible, in accordance with the same thermodynamic principles, to vary the configuration of exhaust manifold 21 so that desirable total flow, pressure drop, and the like are achieved at the final outlet 27 (FIG. 2).

A feature of the invention in its preferred embodiment is that each electronic component, such as each of the eight SCM 14 shown in FIGS. 1 and 2, may be cooled individually by using individual cooling fluid flow paths. This is advantageous for two reasons. First, it avoids the problem of caloric temperature rise in the cooling fluid due to the progressive cooling of components in sequence. That is, if a series of components is cooled in a common flow path (for example, the series of DIMM 15 are cooled within the common flow path provided by DIMM manifold 22), the heat transfer into the fluid from the first component raises the temperature of the fluid before the next component is cooled, and so on for each successive component. In the case of components that give off large amounts of heat, it is possible that the ability of the fluid to cool components near the end of the series will be compromised, if not entirely eliminated. For example, it is not unusual for the major semiconductor components of a supercomputer to generate 40 watts of heat. In a design having reasonable air volumes and velocities, this would require a stream of air to absorb an increase of approximately 10° C. for each component. If a series of such components were cooled with a system capable of re-cooling 40° C. return air down to 20° C. for supply to the components, only two components could be accommodated in a single common flow path. This would place a serious constraint on the design of the supercomputer.

Second, a cooling system having individual cooling fluid flows for individual components is a more robust design that easily accommodates variations in the cooling needs of the individual components due to the different amounts they may generate. The problem of caloric temperature rise is present whether the heatproducing electronic components are identical or not. But, if the components are not identical, a cooling system design that treats all components the same is not desired, because it tends to overcool less demanding components in order to have the capacity to adequately cool the more demanding components. The result is a less than optimal design in terms of fluid capacity and cost. The approach of individual cooling fluid flows allows for a more efficient design that will operate at a lower cost.

FIGS. 4–7 show a preferred embodiment of a heat sink 17 that may be used in preferred embodiments of the invention when increased heat transfer between an electronic component and the cooling fluid is needed. Heat sink 17 is thermally coupled to an electronic component and located within the flow of cooling fluid directed to that electronic component. Heat sink 17 is designed to both dissipate heat and direct the flow of the cooling fluid in an optimum manner.

In general terms, heat sink 17 comprises an enclosure defining an interior, an inlet, and an outlet, and a series of fins within the interior and in thermal contact with the enclosure. Cooling fluid flows in a first direction through the inlet into thermal contact with the fins, then in a second direction substantially perpendicular to the first direction, then out the outlet.

In the preferred embodiment shown, the enclosure is formed by base 18, top plate 20 that surrounds a series of folded fins 19 on two sides and the top of heat sink 17, and back plate 28. The folded fins 19 are in thermal contact with base plate 18. Base plate 18 is placed in thermal contact with the electronic component to be cooled. The preferred material for base plate 18 is type 6061 aluminum; for folded fins 19, type 1100 aluminum; and for top plate 20 and back plate 28, type 6061 aluminum is preferred . Other possible materials include aluminum oxides, ceramics, and copper. However, the invention is not limited to such materials and other suitable substitutes may be used.

Folded fins 19 are produced by repeatedly folding a flat, flexible length of material into the configuration shown, and attaching the folded fins to the base plate by known techniques that produce a thermal bond, such as brazing or the preferred embodiment of thermally conductive (preferably at least 90 W/mK) filler material. The filler material is also the preferred means to attach back plate 28 to the other components of heat sink 17.

Heat sink 17 is preferably sized and shaped to serve the role for region 35 as described above and illustrated in FIG. 3. In particular, this means that heat sink 17 is open to fluid flow in the substantially perpendicular directions indicated by inlet arrow 25 and outlet arrow 26. This is accomplished by omitting any face plate that might be opposite back plate 28, and also cutting away both top plate 20 and the upper region of folded fins 19 at outlet 29. Cutting away the upper region of folded fins 19 is required to permit fluid that flows on alternate sides of any given fin to exit heat sink 17 and therefore exploit as much fin surface area as possible. There is a tradeoff between the amount of area removed and the pressure drop of fluid passing through the opening. The preferred technique of cutting away the upper region is electrodischarge machining, but any convenient method that exposes both sides of folded fins 19 may be used.

Preferred dimensions for base 18 are sixty millimeters length, forty-three millimeters width, three millimeters thickness. For folded fins 19, length as required, forty-three millimeters sheet width, 0.41 millimeter sheet thickness, 19 cycles of two folds (one upper, one lower) at nineteen millimeters height and 1.56 millimeters center-to-center distance. For top plate 20, length as required, thirty-one millimeters width, 0.81 millimeter thickness. For back plate 28, sixty millimeters length, forty-three millimeters width, 0.81 millimeter thickness. Outlet 29 preferably begins two millimeters from back plate 28, is ten millimeters in width, and cuts into folded fins 19 a depth of two millimeters. These dimensions are suitable for a cooling system in which a rectangular exhaust manifold serving eight heat sinks has a capacity of 37 cfm of air (4.6 cfm per heat sink) at 1400 fpm air velocity, the heat sinks are in thermal contact with eight identical SCMs each generating heat at a rate of forty watts, and the temperature of each SCM must be maintained below 85° C. Of course, these dimensions are exemplary only, and other dimensions may be substituted.

In an alternative embodiment of heat sink 17, folded fins 19 are replaced with well-known solid fins, such as those produced by milling a block of material into a unified base/fin structure. In this embodiment, to expose both sides of each fin it is only necessary to size top plate 20 to produce outlet 29, and not necessary to cut into the fins to any depth.

At least one exhaust manifold to collect cooling fluid after thermal contact of the fluid with the electronic components is preferred. When the cooling fluid is air, it is possible to omit the exhaust manifold and either let the heated air dissipate or use whatever enclosure may surround the equipment serve as a return air plenum. Neither of these approaches is preferred because they are inefficient compared to the use of an exhaust manifold, which permits the re-use of only moderately heated air (as opposed to cooling ambient air) by returning the exhausted air to the cooling source, as is well-known in the art.

In the other direction of cost and complexity, it is possible for the exhaust manifold to be coupled to the plurality of electronic components by at least one individual component exhaust duct. For example, a component generating a significantly larger amount of heat than other components could have a dedicated exhaust manifold, directed to a separate (larger capacity) cooling system than is used to re-cool the exhausted fluid from the other components.

FIG. 8 is a schematic illustration of four possible combinations of supply and exhaust manifold configurations within the scope of the invention. In each configuration, electronic components (indicated as shaded boxes) are coupled to supply (S) and return (R) manifolds, and the direction of flow of cooling fluid is indicated by arrows. For convenience, actual cooling mechanisms (e.g., coils) and pumps/fans are not shown. The number of electronic components is arbitrary, as is whether their cooling needs are identical or different, except as noted below.

Figure 8A:
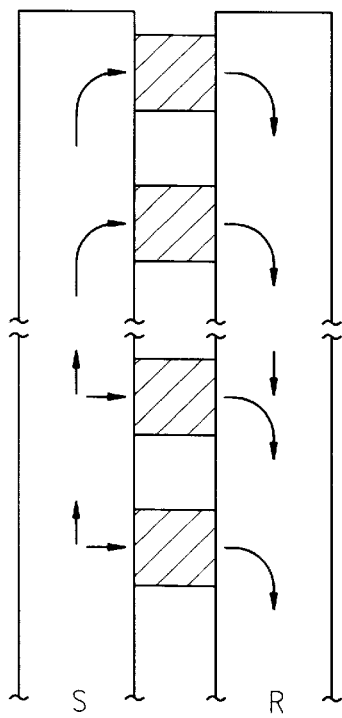
FIG. 8 is a schematic illustration of four possible combinations of supply and exhaust manifold configurations within the scope of the invention.
Figure 8B:
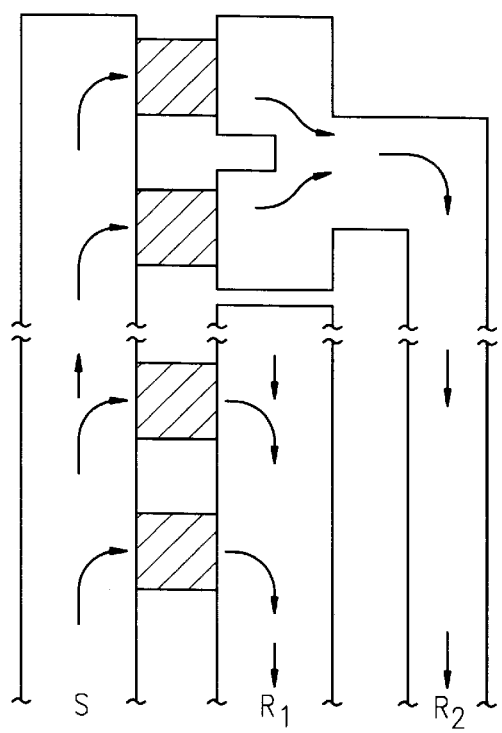
Figure 8C:
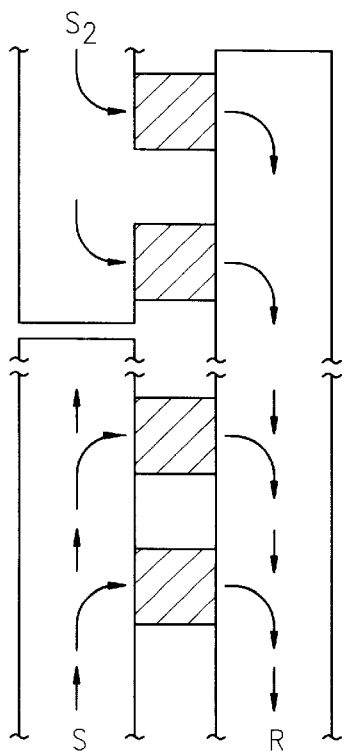
Figure 8D:
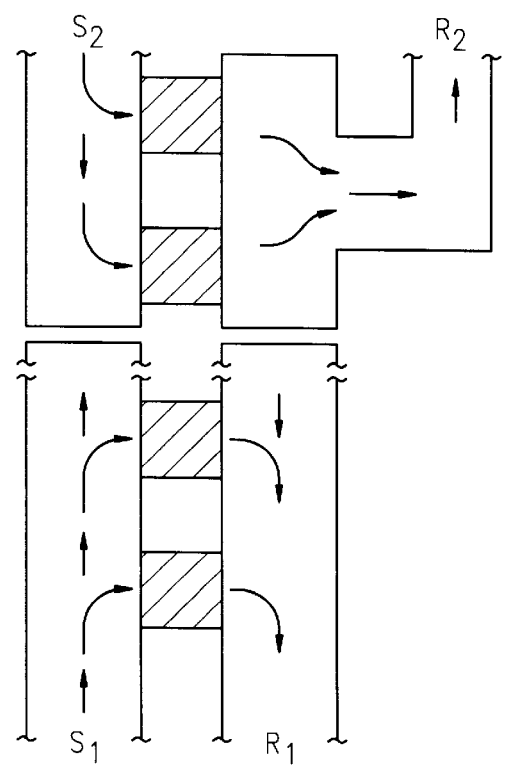

FIG. 8a illustrates the simplest configuration, in which each component is coupled to a common supply manifold S and a common return manifold R. FIG. 8b shows the situation described immediately above, in which individual component exhaust ducts $R_1$ and $R_2$ are used to serve the two lower and upper components, respectively. This configuration could be used when the two sets of components have different cooling loads and it is desired to treat their (different temperature) exhaust streams differently for any reason (such as the separate cooling system described above). FIG. 8c illustrates this principle as applied to the supply side, i.e., separate supply manifolds $S_1$ and $S_2$ are directed to the two sets of components, and a common return manifold is employed. FIG. 8d is the combination of the two approaches, but it should be clear that each of the $S_1$-$R_1$ and $S_2$-$R_2$ systems is simply a smaller version of the S-R system of FIG. 8a.

Figure 9:
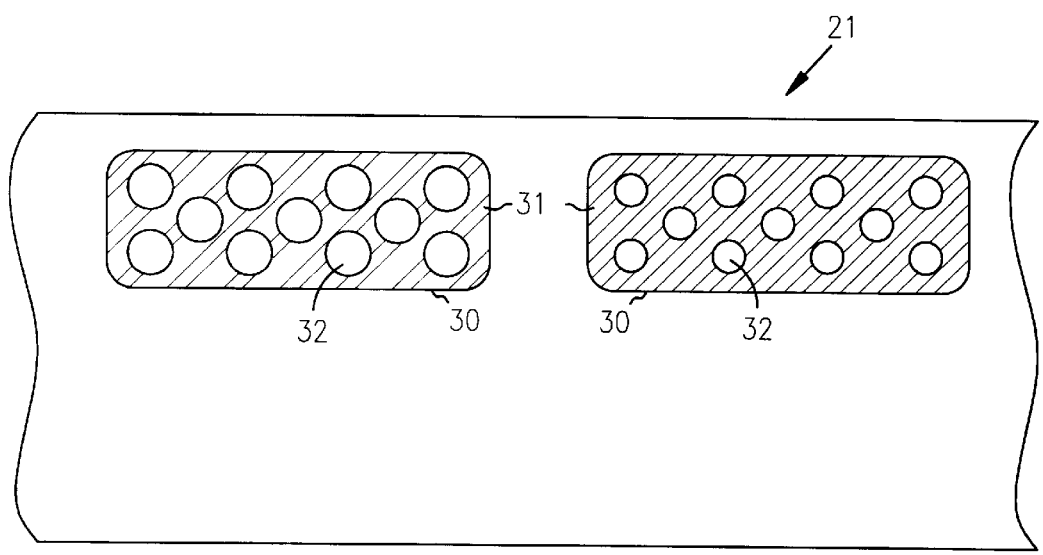
FIG. 9 is a bottom interior view of an embodiment of the exhaust manifold component of the invention.

FIG. 9 is an interior bottom view of a preferred embodiment of a portion of exhaust manifold 21. This view emphasizes the importance of balancing cooling fluid flow among the individual flow paths from each electronic component. Even in the case in which the individual components are identical in their cooling demand, the cumulative amount of fluid in exhaust manifold 21 increases from the closed end (the left end as shown in FIG. 2) to the open end where outlet 27 (see FIG. 2) is located. Thus, optimal performance is achieved by adjusting each individual exhaust manifold inlet 30 so that it presents a total open area that balances considerations of cooling fluid volume, temperature gradient, pressure drop, cumulative flow volume, etc.

In gross detail, each individual exhaust manifold inlet 30 is sized, shaped and located to correspond to the full extent of each corresponding outlet 29. In fine detail, the preferred technique for adjusting the total flow area uses intermediate plates 31, each of which includes is a series of holes 32. (Although it is not required, the design is simplified when each hole 32 in a given plate 31 is the same size, and similarly if the collection of holes 32 in each plate 31 is distributed in some uniform or symmetric pattern.) The number and size of the holes will vary among the set of intermediate plates 31 to account for the different cooling fluid volume, pressure drop, cumulative flow volume, etc. to be handled by exhaust manifold 21 at each location.

In a preferred embodiment, in which air was the cooling fluid, the best balance of air flow through a series of eight outlets 29 was achieved when the total open area was approximately 85% at the outlet 29 farthest from the final outlet 27, decreasing progressively to a final value of approximately 45% at the final outlet 27. Air flows through each outlet 29 were within the approximate range of 275–375 feet/minute, and varied (one standard deviation) by less than 10% from the mean value of approximately 330 feet/minute. The total air flow at final outlet 27 was approximately 1400 feet/minute. The temperatures of eight identical components varied (one standard deviation) by less than 2% of the mean of the eight temperature values.

Of course, the art of cooling electronic components includes the use of both liquid and gaseous fluids for cooling, and both are within the scope of the invention.

And, as is very well-known, electronics equipment can be oriented in virtually any direction. Thus, as used in the entire disclosure above, the terms "horizontal," "vertical," "upward," "lateral," etc. identify only relative directions with respect to the circuit board regardless of its absolute orientation.

We claim:

1. A system for cooling a plurality of electronic components, comprising a plurality of individual cooling fluid supply manifolds, wherein each of the plurality of individual cooling fluid supply manifolds is attached to one electronic component and is only in thermal contact with one electronic component.

2. The system of claim 1, wherein each of the plurality of individual cooling fluid supply manifolds provides an individual stream of cooling fluid to the one electronic component that the cooling fluid supply manifold is attached to.

3. The system of claim 1, wherein at least one of the plurality of individual cooling fluid supply manifolds is adapted to provide a different cooling fluid supply rate than at least one other cooling fluid supply manifold, wherein at least one electronic component is cooled at a different rate than at least one other electronic component.

4. The system of claim 1, further comprising a heat sink thermally coupled to the electronic component and located within the cooling fluid supply manifold of that electronic component.

5. The system of claim 1, further comprising at least one exhaust manifold downstream of any electronic component.

6. The system of claim 5, in which the cooling fluid exhaust manifold is coupled to the plurality of electronic components by a plurality of individual component exhaust ducts.

7. The system of claim 1 further comprising a cooling fluid.

8. The system of claim 7, in which the cooling fluid is a liquid.

9. The system of claim 7, in which the cooling fluid is a gas.

10. A method of cooling a plurality of electronic components, comprising:
 a) providing a supply of cooling fluid,
 b) providing a plurality of supply manifolds, wherein each of the plurality of supply manifolds is attached to an electronic component, and
 c) flowing a portion of the cooling fluid, under negative pressure, through each supply manifold and into thermal contact with only one electronic component.

11. The method of claim 10, wherein flowing a portion of the cooling fluid comprises flowing a different sized portion of the cooling fluid through at least one of the plurality of supply manifolds relative to a size of cooling fluid flowing through another of the plurality of supply manifolds, wherein at least one electronic component is cooled at a different rate than at least one other electronic component.

12. The method of claim 10, wherein each of the plurality of supply manifolds provides an individual stream of cooling fluid to the one electronic component that the cooling fluid supply manifold is attached to.

13. The method of claim 10, further comprising thermally coupling at least one heat sink within a supply manifold of at least one electronic component.

14. The method of claim 10, further comprising providing at least one exhaust manifold downstream of any electronic component.

15. The method of claim 14, further comprising coupling the exhaust manifold to the plurality of electronic components by a plurality of individual component exhaust ducts.

16. The method of claim 10, in which the cooling fluid is a liquid.

17. The method of claim 10, in which the cooling fluid is a gas.

18. A system for cooling a plurality of electronic components, the system comprising one or more individual cooling fluid flows each of which deliver a cooling fluid to one of a plurality of individual supply manifolds, each supply manifold attached to and in thermal contact with an electronic component, wherein each of the individual cooling flows remains separate from each of the other cooling flows until an outlet of each of the manifolds.

19. The system of claim 18, further comprising at least one exhaust manifold coupled to the outlet of one or more supply manifolds.

20. The system of claim 18, wherein each of the one or more individual cooling flows is adapted to deliver a proper amount of cooling fluid to each of the individual supply manifolds to remove an amount of heat generated by each of the electronic components.

21. A system for cooling a plurality of electronic components, the system comprising one or more cooling fluid manifolds, each manifold attached to and in thermal contact with an electronic component and each manifold having an inlet adapted to receive an individual cooling fluid flow and an outlet, wherein each outlet is dimensioned to adjust the fluid flow through each manifold so that each individual cooling fluid flow delivers an amount of cooling fluid to each of the plurality of electronic components sufficient to remove pre-determined amounts of heat generated by each of the electronic components.

22. The system of claim 21, wherein each of the individual cooling flows remains separate until an outlet of each of the one or more cooling fluid manifolds.

* * * * *